United States Patent
Takehiro

(10) Patent No.: US 6,838,733 B2
(45) Date of Patent: Jan. 4, 2005

(54) SEMICONDUCTOR DEVICE AND FABRICATION METHOD WITH ETCH STOP FILM BELOW ACTIVE LAYER

(75) Inventor: Shinobu Takehiro, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/441,040

(22) Filed: May 20, 2003

(65) Prior Publication Data

US 2004/0075139 A1 Apr. 22, 2004

(30) Foreign Application Priority Data

Oct. 21, 2002 (JP) ........................................ 2002-305349

(51) Int. Cl.[7] ............................................. H01L 27/12
(52) U.S. Cl. ...................................... 257/347; 438/300
(58) Field of Search ................................ 257/192, 327, 257/334, 347, 349, 354, 586, 401, 623; 438/268, 300

(56) References Cited

U.S. PATENT DOCUMENTS 6,469,350 B1 * 10/2002 Clark et al. ................. 257/349
6,599,803 B2 * 7/2003 Weon et al. ................. 438/300

FOREIGN PATENT DOCUMENTS

| JP | 07-074126 | 3/1995 |
| JP | 2000-133709 | 5/2000 |

* cited by examiner

Primary Examiner—David Nelms
Assistant Examiner—David Vu
(74) Attorney, Agent, or Firm—Volentine Francos & Whitt, PLLC

(57) ABSTRACT

A semiconductor device includes a semiconductor layer formed on part of an insulating layer. The semiconductor layer includes a diffusion region and a channel region. The insulating layer is etched so that the semiconductor layer is separated from the insulating layer below at least part of the diffusion region. The space left below this part of the semiconductor layer is filled by an etch stop film that also covers the side surfaces of the insulating layer. The etch stop film prevents contact holes targeted at the diffusion region from penetrating the insulating layer due to alignment error or defects in the semiconductor layer. Since the etch stop film is not present below the channel region, the electrical characteristics of the semiconductor device are not altered.

9 Claims, 5 Drawing Sheets

SEMICONDUCTOR DEVICE AND FABRICATION METHOD WITH ETCH STOP FILM BELOW ACTIVE LAYER

BACKGROUND OF THE INVENTION

1. Field of the Invention

The present invention relates to a semiconductor device having a semiconductor layer including diffusion and channel regions formed on an insulating layer.

2. Description of the Related Art

One example of such a semiconductor device is a silicon-on-insulator (SOI) device with metal-oxide-semiconductor field-effect transistors (MOSFETs). The SOI structure enables the MOSFETs to operate at high speeds with low power consumption. Compared with the MOSFETs in a semiconductor device having a conventional silicon substrate, the MOSFETs in an SOI device operate faster because they have less junction capacitance, consume less power because their driving voltage can be reduced, and also consume less power because less current leaks through them in the off state.

It is known that further improvements in MOSFET performance can be achieved by reducing the thickness of the silicon semiconductor active layer in an SOI device, thereby enabling the active layer to be fully depleted, improving the MOSFET subthreshold characteristics, and preventing short-channel effects.

The silicon active layer, however, acts as an etch stop film when the interlayer dielectric film above it is etched to form contact holes. If the thickness of the active layer is excessively reduced, some contact holes may penetrate through the active layer and the insulating layer therebelow. The electrodes formed in these contact holes may then create undesired electrical paths (short circuits) between the active layer and the substrate below the insulating layer.

Two Japanese unexamined patent application publications disclose structures that address this problem. A first structure, disclosed in FIG. 5 of publication No. 7-74126 (1995) places an etch stop film above the active layer. A second structure, disclosed in FIG. 18 of publication No. 2000-133709, forms an etch stop film covering the entire insulating layer.

With the first structure, however, inaccurately aligned contact holes may still penetrate through the insulating layer where it is not covered by the active layer, allowing electrodes to come into contact with the supporting substrate. Accordingly, this structure is inapplicable to highly integrated semiconductor devices in which MOSFETs are densely laid out and alignment tolerances are tight.

With the second structure, the characteristics of the MOSFETs are seriously degraded. The insulating layer is a silicon dioxide ($SiO_2$) layer, and the etch stop film is a silicon nitride ($Si_3N_4$) film. As is well known, a non-$SiO_2$ insulating film, such as an $Si_3N_4$ film, forms many silicon-insulator interface levels. In this structure, since the etch stop film is present below the MOSFET channel region, many undesired interface levels are present in the channel region.

SUMMARY OF THE INVENTION

A general object of the present invention is to provide a method of fabricating highly integrated semiconductor devices comprising active layers formed on an insulating layer.

A more specific object is to avoid short circuits between the active layer and a supporting substrate disposed beneath the insulating layer, even if contact holes etched in an interlayer dielectric film above the active layer are misaligned, or penetrate through the active layer.

A further object is to avoid such short circuits without degrading the electrical characteristics of transistors formed in the active layer.

The invented semiconductor device comprises an insulating layer, a semiconductor layer, and an etch stop film.

The semiconductor layer, which is formed on part of the insulating layer, includes a channel region and a diffusion region and functions as the active layer. The bottom surface of the semiconductor layer makes contact with the insulating layer in the channel region and is at least partly separated from the insulating layer in the diffusion region.

The etch stop film covers the side surfaces of the semiconductor layer and the part of the bottom surface of the semiconductor layer that is separated from the insulating layer.

Due to the presence of the etch stop film, after an interlayer dielectric film has been deposited, contact holes can be etched therein with less risk of unintended penetration of the insulating layer, even if the contact holes are misaligned or the semiconductor layer has penetrable defects. Moreover, the etch stop film does not degrade the electrical characteristics of the semiconductor device, because the etch stop film is not present below the channel region.

The invented method of fabricating a semiconductor device includes forming an insulating layer on a substrate, forming a semiconductor layer on part of the insulating layer, forming a diffusion region in the semiconductor layer, etching the insulating layer with the semiconductor layer serving as an etching mask, depositing an etch stop film, and etching the etch stop film. The etching process that etches the insulating layer etches laterally as well as vertically, thereby removing at least part of the insulating layer below the diffusion region in the semiconductor layer. The etch stop film replaces the part of the insulating layer that was removed from below the semiconductor layer. The etching process that etches the etch stop film removes the etch stop film from the top surface of the semiconductor layer, leaving the side surfaces and part of the bottom surface of the semiconductor layer covered by the etch stop film.

The invented fabrication process may include implanting ions into the insulating layer to promote lateral etching thereof.

The invented fabrication process may include forming a gate electrode over the channel region on the semiconductor layer. The processes of depositing and etching the etch stop film may also form sidewalls on the gate electrode. The gate electrode may extend onto the insulating layer, and have different dimensions on the semiconductor layer and the insulating layer, to leave adequate support for the gate electrode even after the insulating layer is etched.

DETAILED DESCRIPTION OF THE INVENTION

Figure 1A:
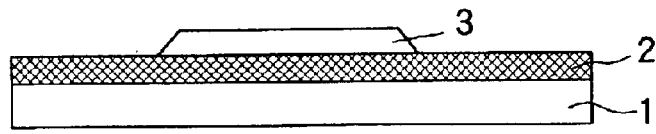
FIGS. 1A, 1B, 1C, 1D, 1E, 1F, and 1G are sectional views illustrating steps in the fabrication of a MOSFET according to a first embodiment of the invention.

Embodiments of the invention will now be described with reference to the attached drawings, in which like elements are indicated by like reference characters.

The fabrication of a semiconductor device according to a first embodiment of the invention will be described with reference to FIGS. 1A to 1G.

The fabrication process starts from a silicon supporting substrate 1 on which an insulating layer 2 such as an $SiO_2$ layer has been formed. The thickness of the insulating layer 2 is, for example, twenty to two hundred nanometers (20–200 nm). A semiconductor layer 3 such as a silicon layer 5–50 nm thick is deposited on the insulating layer 2 and patterned by photolithography and etching to form mesa-shaped active regions, one of which is shown in FIG. 1A.

Figure 1B:
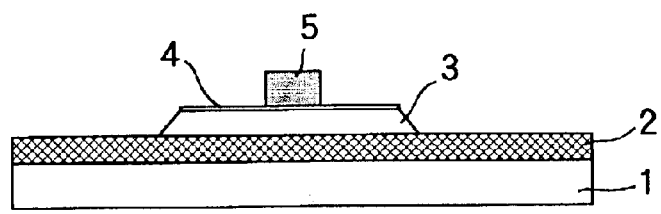

Next, referring to FIG. 1B, the surface of the semiconductor layer 3 is thermally treated to form a gate insulating film 4 such as a silicon nitride film or a silicon oxide film with a thickness of, for example, 0.5–10 nm. A silicon nitride film is preferable because of its higher resistance to etching by hydrofluoric acid (HF). A layer of polycrystalline silicon (polysilicon) is then deposited by chemical vapor deposition (CVD), and patterned by photolithography and etching to form a gate electrode 5 with a thickness of, for example, 10–200 nm.

Figure 1C:
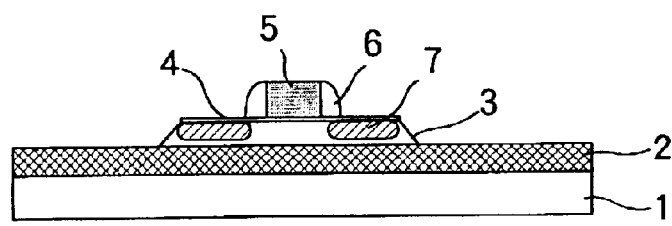

Next, referring to FIG. 1C, a layer of silicon nitride ($Si_3N_4$), for example, is deposited by CVD and etched back to form sidewalls 6 on the gate electrode 5. The sidewalls 6 have a thickness of, for example, 1–100 nm. Phosphorus ions are then implanted into the semiconductor layer 3 to form source and drain diffusion regions 7.

Figure 1D:
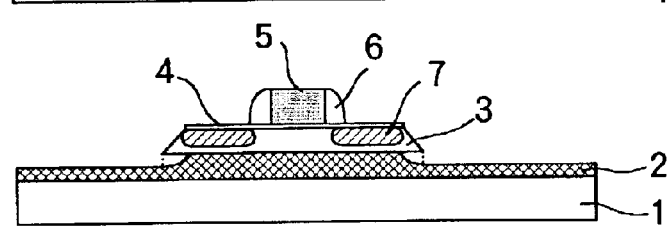

Next, referring to FIG. 1D, the insulating layer 2 is wet-etched by a hydrofluoric acid (HF) solution with a concentration of 0.1% to 50%. The etching time is selected to remove a certain proportion of the 10–200 nm thickness of the insulating layer 2. Although the gate electrode 5, sidewalls 6, and semiconductor layer 3 function as an etching mask, wet etching proceeds laterally as well as vertically, so some insulating material is removed from below the semiconductor layer 3.

Figure 1E:
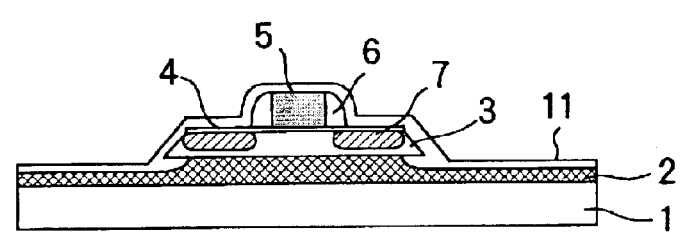

Next, referring to FIG. 1E, a layer of silicon nitride 11 is deposited by CVD. The thickness of the silicon nitride layer 11 is, for example, 5–100 nm.

Figure 1F:
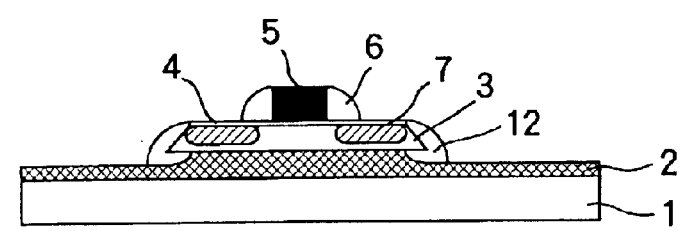

Next, referring to FIG. 1F, the silicon nitride layer 11 is etched back to form an etch stop film 12 covering the side surfaces and the exposed bottom surface of the semiconductor layer 3.

Figure 1G:
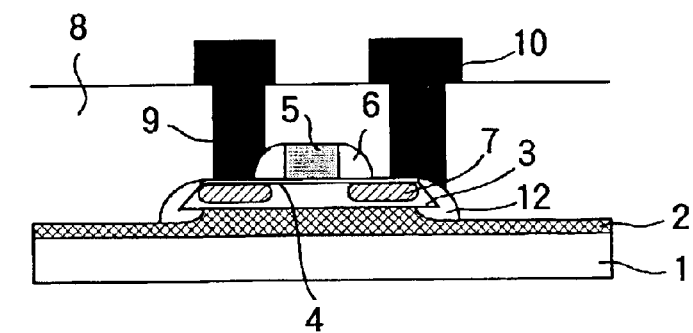

Next, referring to FIG. 1G, an interlayer dielectric film 8 is formed. Contact holes are created in the interlayer dielectric film 8 by photolithography and etching, using an etchant that etches the interlayer dielectric film 8 much more rapidly than the etch stop film 12. Contact electrodes 9 are formed by filling the contact holes with a conductive material such as tungsten. An aluminum layer is deposited on the surface of the interlayer dielectric film 8 and patterned by photolithography and etching to form interconnections 10. The finished semiconductor device comprises MOSFETs in which the etch stop film 12 covers the side surfaces and the exposed bottom surface of the semiconductor layer semiconductor layer 3 deposited on the insulating layer 2.

In this embodiment, even if the contact holes are inaccurately aligned and partially miss the semiconductor layer 3 as shown in FIG. 1G, they will not penetrate through the insulating layer 2, because the etch stop film 12 covers the insulating layer 2 adjacent the side surfaces of the semiconductor layer 3. The alignment tolerance thus increases by an amount equal to the width of the etch stop film 12 covering the side surfaces of the semiconductor layer 3. The etch stop film filling the space below the bottom edges of the semiconductor layer 3 (excluding the channel region below the MOSFET gate electrode 5) prevents contacts holes from penetrating through the insulating layer 2 even if the semiconductor layer has defects such as very thin parts or pinholes just below the contact holes.

The etch stop film thus improves the yield of the fabrication process. Because the etch stop film does not extend under the channel region in the semiconductor layer just below the gate electrode, the MOSFET characteristics are not degraded.

The order of the steps shown in FIGS. 1C and 1D may be interchanged; that is, the insulating layer 2 may be etched by HF before the sidewalls 6 are formed. The fabrication process can then be simplified by forming the etch stop film 12 and sidewalls 6 simultaneously. In that case, the only step required in addition to the conventional fabrication process steps is the step of wet-etching the insulating layer 2 by an HF solution, so the semiconductor device of this embodiment can be fabricated without changing the fabrication process significantly.

Figure 2:
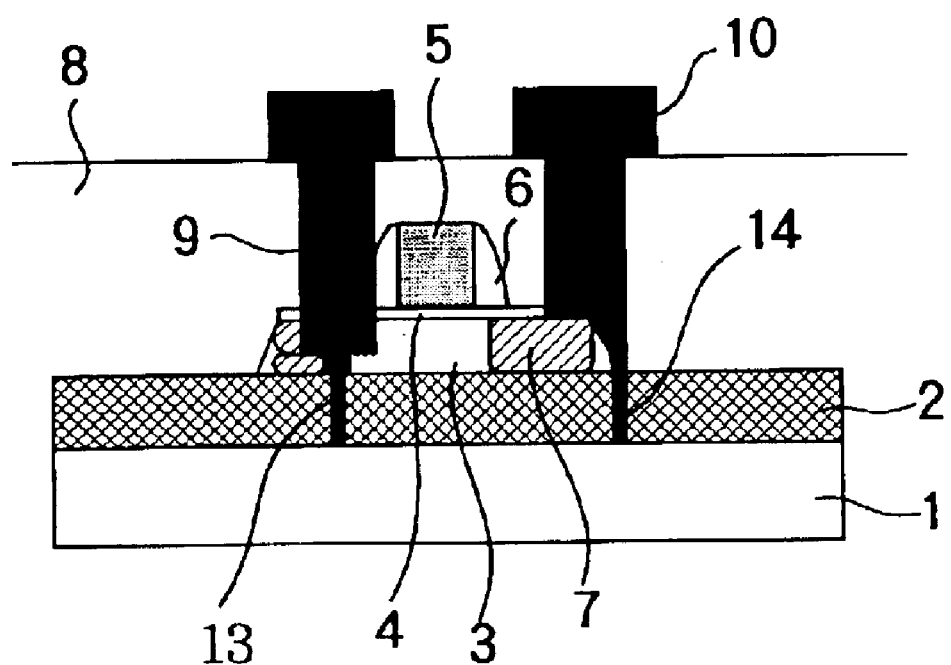
FIG. 2 is a sectional view of a MOSFET in a conventional SOI semiconductor device, illustrating penetration of inaccurately aligned contact holes through the insulating layer.

For comparison, FIG. 2 shows a MOSFET in a conventional SOI semiconductor device lacking the etch stop film of the first embodiment, with the same degree of contact hole misalignment as in FIG. 1G. The left contact hole penetrates a defect in the semiconductor layer 3 and forms a pinhole 13 in the insulating layer 2, through which the left contract electrode 9 reaches the underlying supporting semiconductor layer 1, forming a short circuit between the semiconductor layer 3 and the silicon supporting substrate 1. The right contact hole partially misses the semiconductor layer 3, so an extension 14 of the contact hole is etched through the insulating layer 2, and the contact electrode again short-circuits the semiconductor layer 3 to the silicon supporting substrate 1. The first embodiment avoids these unwanted short circuits between the semiconductor layer 3 and the silicon supporting substrate 1.

The fabrication of a semiconductor device according to a second embodiment of the invention will be described with reference to FIGS. 1A to 1C and 3A to 3C.

The initial fabrication steps, through the formation of source and drain diffusion regions 7, are carried out as in the first embodiment (FIGS. 1A–1C).

Figure 3A:
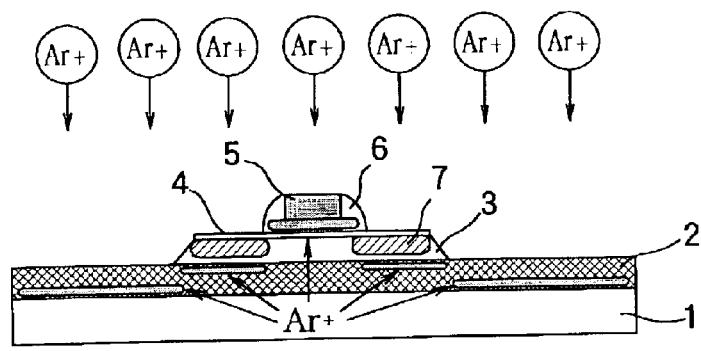
FIGS. 3A and 3B are sectional views illustrating steps in the fabrication of a MOSFET according to a second embodiment of the invention.

Next, referring to FIG. 3A, argon ions ($Ar^+$) are implanted with an acceleration energy in the range from one kiloelectron-volt (1 keV) to one megaelectron-volt (1 MeV) and a dose in the range from $10^{12}$ to $10^{16}$ per square centimeter ($10^{12}$ $cm^{-2}$ to $10^{16}$ $cm^{-2}$), the gate electrode 5 and semiconductor layer 3 acting as a mask. The thick gate electrode 5 has an especially large masking effect, so little or no argon is implanted into the insulating layer below the gate electrode. The acceleration voltage is chosen so that in the region below the semiconductor layer 3, except for the region below the gate electrode 5, the argon ions are implanted into the part of the insulating layer 2 close to the interface with the semiconductor layer 3. In regions outside the region below the semiconductor layer 3, the argon ions are implanted more deeply into the insulating layer 2.

Figure 3B:
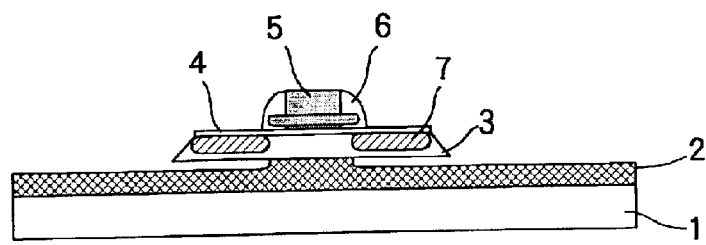

Next, referring to FIG. 3B, the insulating layer 2, which has a thickness of, for example, 10–200 nm, is wet-etched by an HF solution with a concentration of, for example, 0.1% to 50%. As is well known, the implantation of ions into an oxide film and the film imperfections resulting from the ion implantation cause the wet etching rate to increase. Accordingly, substantially all of the part of the insulating layer 2 close to the interface with the semiconductor layer 3 is quickly removed, except in the region below the gate electrode 5. The etching process is stopped at this point, before any significant amount of the insulating material not including implanted argon ions is removed. The part of the insulating layer 2 below the gate electrode 5 is left substantially intact.

Figure 3C:
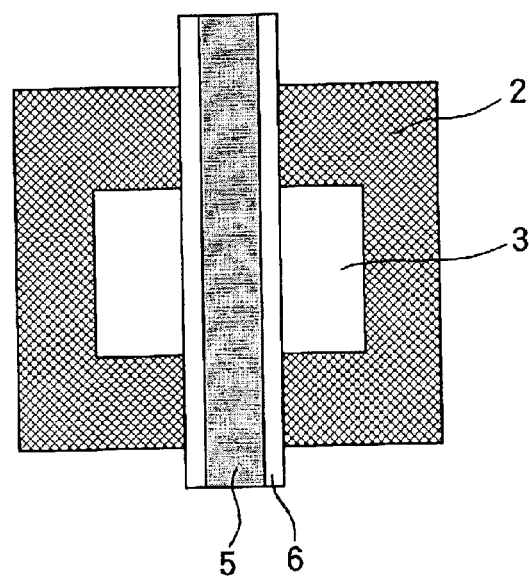
FIG. 3C is a plan view of the MOSFET shown in FIGS. 3A and 3B.

Referring to FIG. 3C, the gate electrode 5 extends beyond the semiconductor layer 3 toward adjacent MOSFETs (not shown). In the regions between adjacent MOSFETs, located above and below the semiconductor layer 3 in FIG. 3C, the gate electrode 5 is formed directly on the insulating layer 2. When the insulating layer 2 is etched, the part of the insulating layer 2 disposed below the gate electrode 5 in these regions between adjacent MOSFETs is also left substantially intact.

Finally, a layer of silicon nitride is deposited and etched back to form an etch stop film as described in the first embodiment. The subsequent steps of depositing an interlayer dielectric film and forming contacts and interconnections are also carried out as in the first embodiment.

In the first embodiment, since the etching rate is the same everywhere, while insulating material is being removed from the region below the semiconductor layer 3, insulating material is also being removed at the same rate from parts of the insulating layer 2 disposed below the gate electrode 5 in the regions between adjacent MOSFETs, where there is no semiconductor layer 3. If the etching time were to be prolonged sufficiently to ensure removal of the same amount of insulating material as in FIG. 3B, then in these regions between adjacent MOSFETs, so much insulating material might be removed as to leave the gate electrode 5 unsupported. In the worst case, the insulating layer 2 and gate insulating film 4 might be completely removed from beneath the gate electrode 5 in a region between adjacent MOSFETS. Depending on the length of this region, the unsupported gate electrode might then sag sufficiently to make contact with the silicon supporting substrate 1, causing a short circuit.

In comparison with the first embodiment, the second embodiment permits more of the insulating layer 2 below the semiconductor layer 3 to be etched without the risk of over-etching in regions between MOSFETs where no semiconductor layer 2 is present. The etch stop film formed later therefore covers a greater portion of the bottom surface of semiconductor layer 3 below the diffusion regions 7, further reducing the possibility that contact holes might penetrate through the semiconductor layer 3 and insulating layer 2 to the silicon supporting layer 1.

The fabrication of a semiconductor device according to a third embodiment of the invention will be described with reference to FIGS. 1A to 1C and 4A to 4E.

Figure 4C:
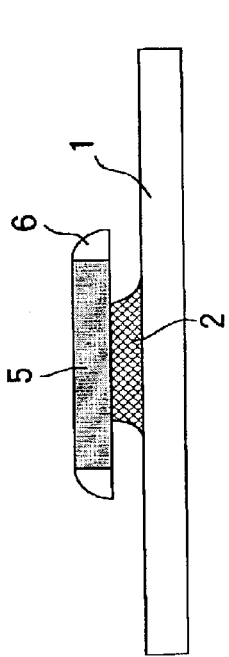
FIGS. 4B, 4C, 4D, and 4E are sectional views illustrating further steps in the fabrication process according to the third embodiment.

The initial fabrication steps, through the formation of source and drain diffusion regions 7, are carried out as in the first embodiment (FIGS. 1A–1C), except that the gate length is not constant. In the patterning process that forms the gate electrode 5, the parts of the gate electrode 5 disposed directly on the insulating layer 2 are made longer than the parts disposed on the semiconductor layer 3, as shown in FIG. 4A. The gate length is the dimension of the gate electrode measured in the direction of current flow in the semiconductor layer 3 between the source and drain diffusions; this direction is perpendicular to the longitudinal axis of the gate electrode 5.

Next, the insulating layer 2 is wet-etched by an HF solution. Referring to FIG. 4B, which is a sectional view taken along line B–B' in FIG. 4A, the etching time is selected so that in the regions below the semiconductor layer 3, substantially all of the insulating layer 2 is removed, except for the part below the gate electrode 5. In the regions between MOSFETs, where the semiconductor layer 3 is not present, a similar amount of insulating material is removed, but because of the greater length of the gate electrode 5, an adequate amount of the insulating layer 2 is left to support the gate electrode, as shown in FIG. 4C, which is a sectional view taken along line C–C' in FIG. 4A. (FIG. 4A shows the state before the wet-etching process; FIGS. 4B and 4C show the state after the wet-etching process.)

Figure 4D:
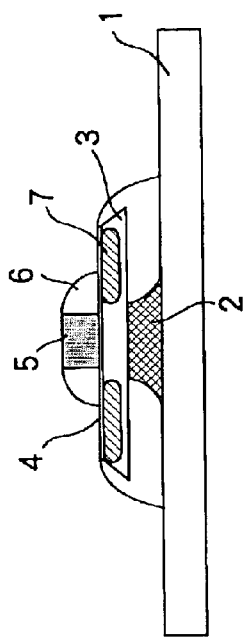

Next, as in the first embodiment, a layer of silicon nitride is deposited by CVD and etched back to form an etch stop film 12 covering the side surfaces and exposed bottom surface of the semiconductor layer 2, as shown in FIG. 4D.

Figure 4E:
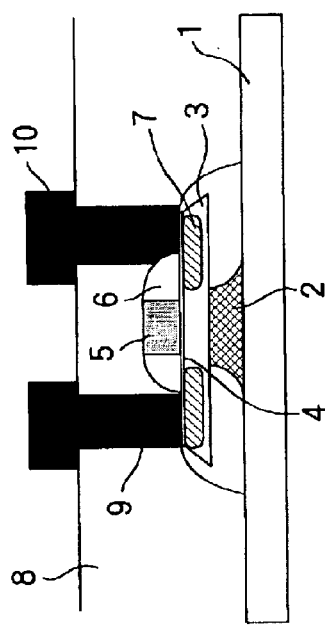
Figure 4A:
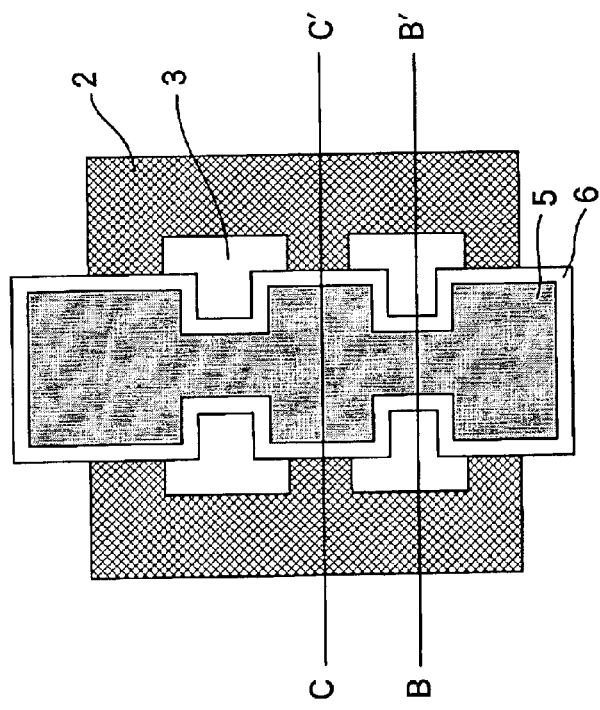
FIG. 4A is a plan view illustrating a step in the fabrication of a pair of MOSFETs according to a third embodiment of the invention.
Figure 4B:
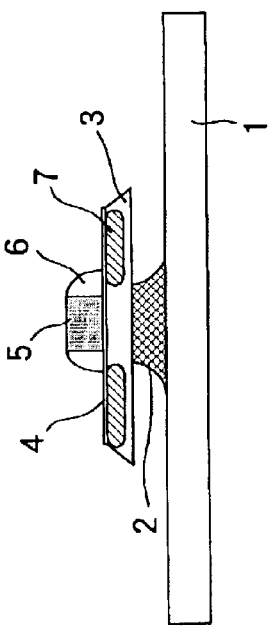

Next, contact electrodes 9 and interconnections 10 are formed by as in the first embodiment, as shown in FIG. 4E.

Compared with the second embodiment, the third embodiment provides even greater protection against short circuits between the semiconductor layer 3 and the silicon supporting substrate 1, because more silicon nitride can be deposited below the diffusion regions 7 of the semiconductor layer 3 without loss of support for the gate electrode in regions in which the semiconductor layer 3 is not present.

Figure 5:
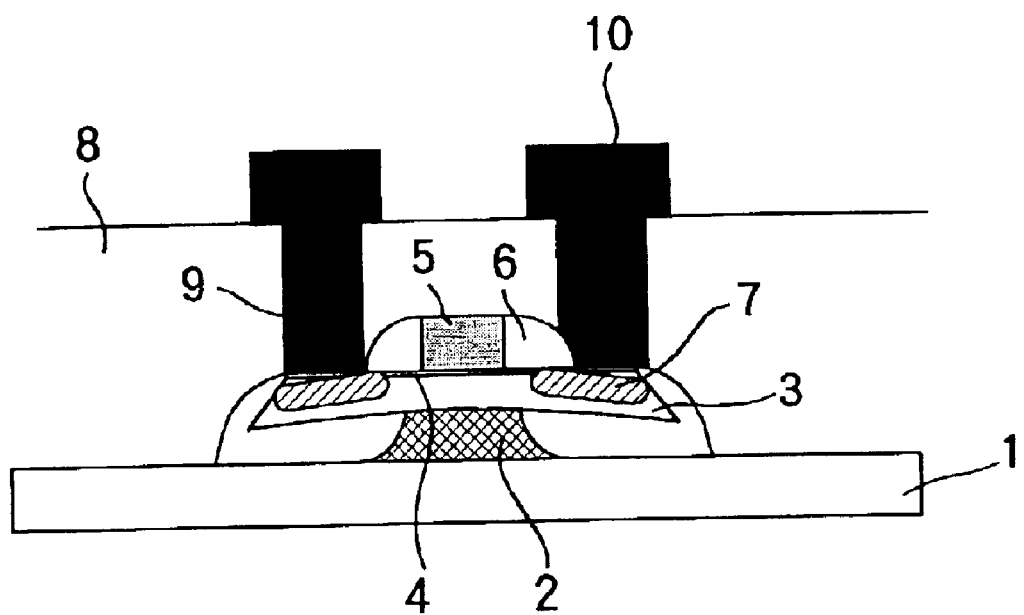
FIG. 5 is a sectional view illustrating a MOSFET in a semiconductor device fabricated according to a fourth embodiment of the invention.

A semiconductor device according to a fourth embodiment of the invention will now be described with reference to FIG. 5. The fourth embodiment differs from the first to third embodiments in that after the insulating layer is wet-etched by an HF solution, when a layer of silicon nitride is deposited by CVD to form an etch stop film 12 below the semiconductor layer 3, the CVD conditions are selected so that the deposited layer has a greater thermal shrinkage factor than that of silicon or $SiO_2$.

One example of such CVD conditions is a temperature of 600° C. to 800° C. and a pressure of 0.1 to 1 Torr. As the film deposition temperature or pressure decreases, the thermal shrinkage factor of silicon nitride increases, so a low deposition temperature and pressure are preferable.

When the device returns to room temperature following formation of the etch stop film 12, the etch stop film 12 shrinks more than semiconductor layer 3 and insulating layer 2. Therefore, the thin semiconductor layer 3 is curved downward on both sides of the insulating layer 2 below the gate electrode 5, and a tensile strain is generated in the semiconductor layer. The tensile strain increases the mobility of carriers in n-channel MOSFETs, as is well known. Accordingly, the performance of n-channel MOSFETS is improved in this embodiment.

Various modifications may be made in the first to fourth embodiments described above.

In the first embodiment, adjacent MOSFETs or other circuit elements may be mutually isolated by local oxidation of silicon (LOCOS). The gate insulating film 4 may be a metal oxide film such as a film of $ZrO_2$, $HfO_2$, or $At_2O_3$, instead of a silicon-based film. The etch stop film 12 is not limited to silicon nitride, but may comprise another dielectric material having a lower etching rate than the etching rate of the interlayer dielectric film 8, so that it will not be significantly etched during the etching process that forms the contact holes. For example, a silicon etch stop film can be used, reducing the resistance of the diffusion regions 7.

The ions implanted in the second embodiment to increase the etching rate of the insulating layer 2 are not limited to argon ions; ions of another element may be implanted.

The HF wet-etching step in the third embodiment need not remove all of the insulating layer 2 below the parts of semiconductor layer 3 not disposed below the gate electrode 5. Some insulating material may be left in these parts.

The second and third embodiments may be combined.

In the fourth embodiment, the etch stop film may be deposited under conditions such that its thermal shrinkage factor is less than either that of the semiconductor layer 3 or that of the insulating layer 2, but not both. This will improve the driving capability of p-channel MOSFETs. The etch stop film may be deposited so as to have different thermal shrinkage factors in n-channel MOSFET regions and p-channel MOSFET regions.

In any of the above embodiments, the insulating layer 2 may be etched by a dry-etching process instead of a wet-etching process. If dry etching is used, an isotropic dry etching process is preferable.

The source and drain diffusion regions 7 may be formed at any stage before the contact holes are formed.

Those skilled in the art will recognize that further variations are possible within the scope of the invention, which is defined by the appended claims.

What is claimed is:

1. A semiconductor device comprising:

an insulating layer;

a semiconductor layer formed on the insulating layer, the semiconductor layer including a channel region and a diffusion region adjacent the channel region, the semiconductor layer having side surfaces and a bottom surface, the bottom surface making contact with the insulating layer in the channel region and being at least partly separated from the insulating layer in the diffusion region; and an etch stop film covering the side surfaces of the semiconductor layer and covering the part of the bottom surface of the semiconductor layer separated from the insulating layer.

2. The semiconductor device of claim 1, wherein the etch stop film is formed as a unitary film.

3. The semiconductor device of claim 1, wherein the etch stop film is formed on the insulating layer.

4. The semiconductor device of claim 1, wherein the bottom surface of the semiconductor layer is separated from the insulating layer in all parts of the diffusion region.

5. The semiconductor device of claim 1, wherein the etch stop film and the insulating layer have different thermal shrinkage factors.

6. The semiconductor device of claim 5, wherein the bottom surface of the semiconductor layer covered by the etch stop film curves toward the insulating layer.

7. The semiconductor device of claim 1, further comprising a gate electrode extending in a first direction over the channel region of the semiconductor layer, the etch stop film, and the insulating layer, the gate electrode having a first length within the channel region and a second length, different from the first length, exterior to the channel region, the first and second lengths being measured in a second direction perpendicular to the first direction.

8. The semiconductor device of claim 7, wherein the second length is greater than the first length.

9. The semiconductor device of claim 8, wherein the insulating layer is substantially absent below the diffusion region.

* * * * *